US012604585B2

(12) United States Patent
Imazeki et al.

(10) Patent No.: US 12,604,585 B2
(45) Date of Patent: Apr. 14, 2026

(54) MICROLED CONNECTION WITH CU BUMP ON TI/AL WIRE

(71) Applicant: Japan Display Inc., Tokyo (JP)

(72) Inventors: Yoshikatsu Imazeki, Tokyo (JP); Yoichi Kamijo, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 295 days.

(21) Appl. No.: 18/200,579

(22) Filed: May 23, 2023

(65) Prior Publication Data

US 2023/0420626 A1     Dec. 28, 2023

(30) Foreign Application Priority Data

May 23, 2022     (JP) ................................. 2022-083639

(51) Int. Cl.
    *H01L 33/62*     (2010.01)
    *H10H 20/857*     (2025.01)
    *H10H 20/01*     (2025.01)

(52) U.S. Cl.
    CPC ....... *H10H 20/857* (2025.01); *H10H 20/0364* (2025.01)

(58) Field of Classification Search
    CPC ......................... H10H 20/857; H10H 20/0364
    See application file for complete search history.

(56) References Cited

U.S. PATENT DOCUMENTS

| | | | | |
|---|---|---|---|---|
| 2019/0386173 A1* | 12/2019 | Chen | ..................... | H10H 20/812 |
| 2020/0343230 A1* | 10/2020 | Sizov | ...................... | H01L 25/18 |
| 2021/0407976 A1* | 12/2021 | Liang | ..................... | H10D 86/60 |
| 2022/0285332 A1 | 9/2022 | Aoki et al. | | |

FOREIGN PATENT DOCUMENTS

| | | | | | |
|---|---|---|---|---|---|
| CN | 102915986 B | * | 4/2015 | ............. | H01L 24/13 |
| CN | 116632148 A | * | 8/2023 | ........... | H10H 20/857 |
| JP | 2021-085904 A | | 6/2021 | | |

OTHER PUBLICATIONS

Zainudin et al., "Optimization of reflow profile for copper pillar with SAC305 solder cap FCCSP", J Mater Sci: Mater Electron (2023) 34:187.*

\* cited by examiner

*Primary Examiner* — Peter Bradford
(74) *Attorney, Agent, or Firm* — XSENSUS LLP

(57) ABSTRACT

An electronic device has: a substrate; a wiring formed on the substrate; an inorganic insulating layer covering the wiring; and a bump electrode that is connected to the wiring at a position of overlapping a first opening formed in the inorganic insulating layer and protrudes form the inorganic insulating layer. The wiring is a laminated film of: a first conductor layer made of titanium or a titanium alloy and formed on the substrate; and a second conductor layer made of aluminum or an aluminum alloy and laminated on the first conductor layer. The bump electrode includes: a first conductor portion made of copper or a copper alloy and bonded to the wiring; and a second conductor portion made of solder containing tin and formed on the first conductor portion.

8 Claims, 15 Drawing Sheets

MICROLED CONNECTION WITH CU BUMP ON TI/AL WIRE

CROSS-REFERENCE TO RELATED APPLICATION

The present application claims priority from Japanese Patent Application No. 2022-083639 filed on May 23, 2022, the content of which is hereby incorporated by reference into this application.

TECHNICAL FIELD OF THE INVENTION

The present invention relates to an electronic device and a manufacturing method thereof.

BACKGROUND OF THE INVENTION

There is an electric device on which a plurality of electrodes arranged on a substrate is mounted. For example, Japanese Patent Application Laid-open No. 2021-85904 (Patent Document 1) discloses an LED (Light Emitting Diode) display apparatus in which a plurality of light emitting elements are mounted on a plurality of electrodes arranged on a substrate.

SUMMARY OF THE INVENTION

For example, in a case of an electronic device with a large planar size like an LED display apparatus, a laminated film of titanium, aluminum, and titanium (hereinafter, this laminated film may be referred to as a TAT laminated film) may be used as power for driving a plurality of electronic devises and as a wiring material for transmitting signals. In forming a bump electrode for connecting to an electronic component on this wiring, it is preferable to form a wiring material for the bump electrode made of a metal material with low electrical resistance like copper etc. However, it has been found that there is room for improvement in terms of a shape of the bump electrode and complexity of a manufacturing process when a copper bump electrode is formed on a wiring made of TAT.

An object of the present invention is to provide a technique for improving performance of electronic devices.

An electronic device according to one embodiment has: a first substrate made of glass or a resin; a first wiring formed on the first substrate; a first insulating layer being an inorganic insulating layer which is made of an inorganic material, the first insulating layer covering the first wiring; and a bump electrode connected to the first wiring at a position of overlapping a first opening formed in the first insulating layer, the bump electrode protruding from the first insulating layer. The first wiring is a laminated film of: a first conductor layer, which is made of titanium or a titanium alloy and is formed on the first substrate; and a second conductor layer, which is made of aluminum or an aluminum alloy and is laminated on the first conductor layer. The bump electrode includes: a first conductor portion, which is made of copper or a copper alloy and is bonded to the first wiring; and a second conductor portion, which is made of solder containing tin and is formed on the first conductor portion.

A manufacturing method of an electronic device according to another embodiment includes: (a) a step of preparing a substrate structure, the substrate structure including: a first substrate made of glass or a resin; a first wiring formed on the first substrate; and a first insulating layer that is an inorganic made of an inorganic material and covers the first wiring; (b) a step of removing an oxide film of aluminum, which is formed on an exposed surface of the first wiring at a position of overlapping a first opening formed in the first insulating layer; and (c) after the (b) step, a step of forming a bump electrode that is connected to the first wiring at a position of overlapping the first opening and protrudes from the first insulating layer. The first wiring is a laminated film of: a first conductor layer made of titanium or a titanium alloy and formed on the first substrate; and a second conductor layer, which is made of aluminum or an aluminum alloy and is laminated on the first conductor layer. The (c) step includes: (c1) a step of selectively forming, at a position of overlapping the first opening and around the first opening, a first conductor portion made of copper or a copper alloy by an electroplating method while the first wiring is energized; and (c2) after the (c1) step, a step of selectively forming, on the first conductor portion, a second conductor portion made of solder containing tin while the first wiring is energized.

BRIEF DESCRIPTION OF THE DRAWINGS

FIG. 10 is an enlarged sectional view showing a modification example to FIG. 4;

DESCRIPTION OF THE PREFERRED EMBODIMENTS

Figure 1:
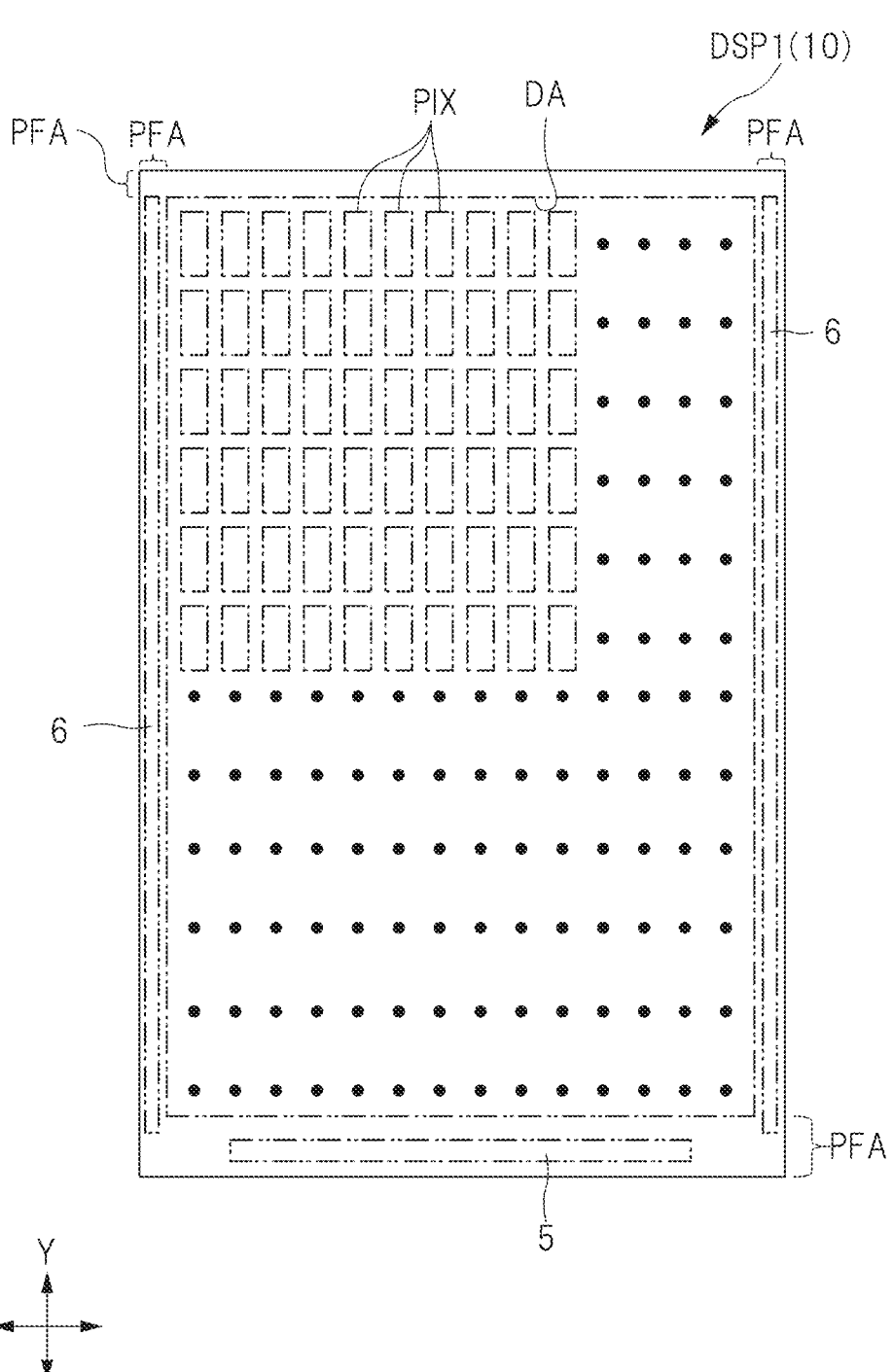
FIG. 1 is a plan view showing a configuration example of a micro LED display apparatus which is one embodiment of an electronic device.

Each embodiment of the present invention will be described below with reference to the drawings. Incidentally, the disclosure is merely one example, and inventions capable of being easily arrived at to the skilled int the art based on appropriate modifications while mainlining the gist of the present invention will be naturally included within the scope of the present invention. In addition, in order to make the description clearer, the drawings may schematically show a width, thickness, and shape, etc. of each part in comparison with the actual embodiment, but this is only an example, and the interpretation of the present invention is not intended so as to be limited. Further, in this specification and each figure, the same or related reference numerals may be given to elements similar to those described above with respect to the previous figures, and a detailed description thereof may be omitted as appropriate.

In the following embodiments, as an example of an electronic device in which a bump electrode array for mounting a plurality of electronic components is arranged, a micro LED display apparatus mounting a plurality of micro LED elements and a bump electrode array device before mounting the plurality of micro LED elements will be taken up and described.

<Electrics Device>

Figure 2:
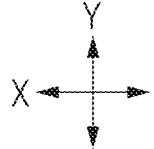
FIG. 2 is a circuit diagram showing a configuration example of circuits around a pixel shown in FIG. 1.

First, a configuration example of a micro LED display apparatus, which is an electronic device according to the present embodiment, will be described. FIG. 1 is a plan view showing a configuration example of a micro LED display apparatus which is an embodiment of an electronic device. In FIG. 1, a boundary between a display area DA and a peripheral area PFA, a control circuit 5, a drive circuit 6, and a plurality of pixels PIX are indicated by a double-dotted lin. FIG. 2 is a circuit diagram showing a configuration example of a circuit around the pixel shown in FIG. 1.

As shown in FIG. 1, a display apparatus DSP1 of the present embodiment includes a display area DA, a peripheral area PFA that surrounds the display area DA in a frame shape, and a plurality of pixels PIX arranged in a matrix within the display area DA. Further, the display apparatus DSP1 also has a substrate 10, a control circuit 5 formed on the substrate 10, and a drive circuit 6 formed on the substrate 10. The substrate 10 is made of glass or a resin. The substrate 10 has a surface 10*t* and a surface 10*b* opposite the surface 10*t*.

The control circuit 5 is a control circuit that controls driving of a display function of the display apparatus DSP1. For example, the control circuit 5 is a driver IC (Integrated Circuit) mounted on the substrate 10. In the example shown in FIG. 1, the control circuit 5 is arranged along one short side of four sides of the substrate 10. Further, in the example of the present embodiment, the control circuit 5 includes a signal line drive circuit that drives wirings (video image signal wirings) VL (see FIG. 2) connected to the plurality of pixels PIX. However, a position and a configuration example of the control circuit 5 are not limited to the example shown in FIG. 1, and they include various modification examples. For example, in FIG. 1, a circuit board such as a flexible board may be connected to the position shown as the control circuit 5, and the above-mentioned driver IC may be mounted on the circuit board. Further, for example, the signal line drive circuit that drives the wiring VL may be formed separately from the control circuit 5.

The drive circuit 6 includes a circuit that drives a scanning signal line GL (see FIG. 2 described later) among the plurality of pixels PIX. The drive circuit 6 also includes a circuit that supplies a reference potential to the LED elements mounted on each of the plurality of pixels PIX. The drive circuit 6 drives a plurality of scanning signal lines GL based on the control signal from the control circuit 5. In an example shown in FIG. 1, the drive circuit 6 is arranged along each of two long sides out of four sides that the substrate 10 has. However, the position and configuration example of the drive circuit 6 are not limited to the example shown in FIG. 1, and has various modification examples. For example, in FIG. 1, a circuit board such as a flexible board may be connected to the position shown as the control circuit 5, and the above-mentioned drive circuit 6 may be mounted on the circuit board.

Next, a circuit configuration example of the pixel PIX will be described by using FIG. 2. Incidentally, although FIG. 2 shows four pixels PIX as representatives, each of the plurality of pixels PIX shown in FIG. 1 has a circuit similar to that of the pixel PIX shown in FIG. 2. Hereinafter, the switch provided in the pixel PIX and the circuit including the LED element 20 may be referred to as a pixel circuit. The pixel circuit is a voltage signal type circuit that controls a light emitting state of the LED element 20 according to a video image signal Vsg supplied from the control circuit 5 (see FIG. 1).

As shown in FIG. 2, the pixel PIX includes an LED element 20. The LED element 20 is a micro light emitting diode described above. The LED element 20 has an anode electrode 20EA and a cathode electrode 20EK. The cathode electrode 20EK of the LED element 20 is connected to a wiring VSL to which a reference potential (fixed potential) PVS is supplied. The anode electrode 20EA of the LED element 20 is electrically connected through a wiring 31 to a drain electrode ED of a switching element SW.

The pixel PIX has the switching element SW. The switching element SW is a transistor that controls a connection state (ON- or OFF-state) between the pixel circuit and the wiring VL in response to the control signal Gs. The switching element SW is, 0.1 for example, a thin film transistor. When the switching element SW is in the ON-state, the video signal Vsg from the wiring VL is inputted to the pixel circuit.

The drive circuit 6 includes a shift register circuit, an output buffer circuit and the like (that are not shown). The driving circuit 6 outputs a pulse based on a horizontal scanning start pulse transmitted from the control circuit 5 (see FIG. 1), and outputs a control signal Gs.

Each of the plurality of scanning signal lines GL extends in an X direction. The scanning signal line GL is connected to a gate electrode of the switching element SW. When the control signal Gs is supplied to the scanning signal line GL, the switching element SW is the ON-state and the video signal Vsg is supplied to the LED element 20.

<Peripheral Structure of LED Element>

Figure 3:
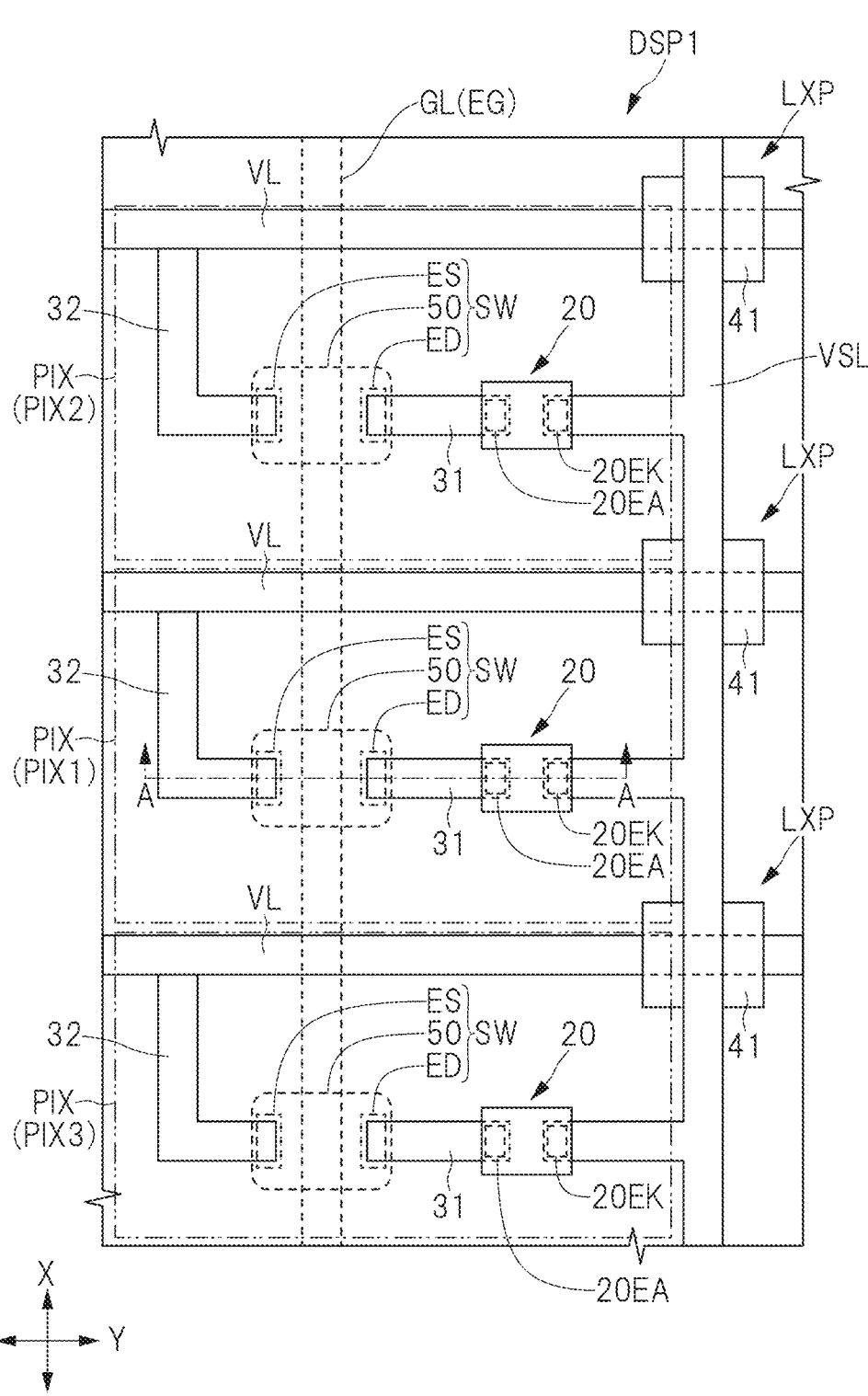
FIG. 3 is a transmissively enlarged plan view showing one example of a peripheral structure of an LED element arranged in each of a plurality of pixels of the display apparatus shown in FIG. 1.
Figure 4:
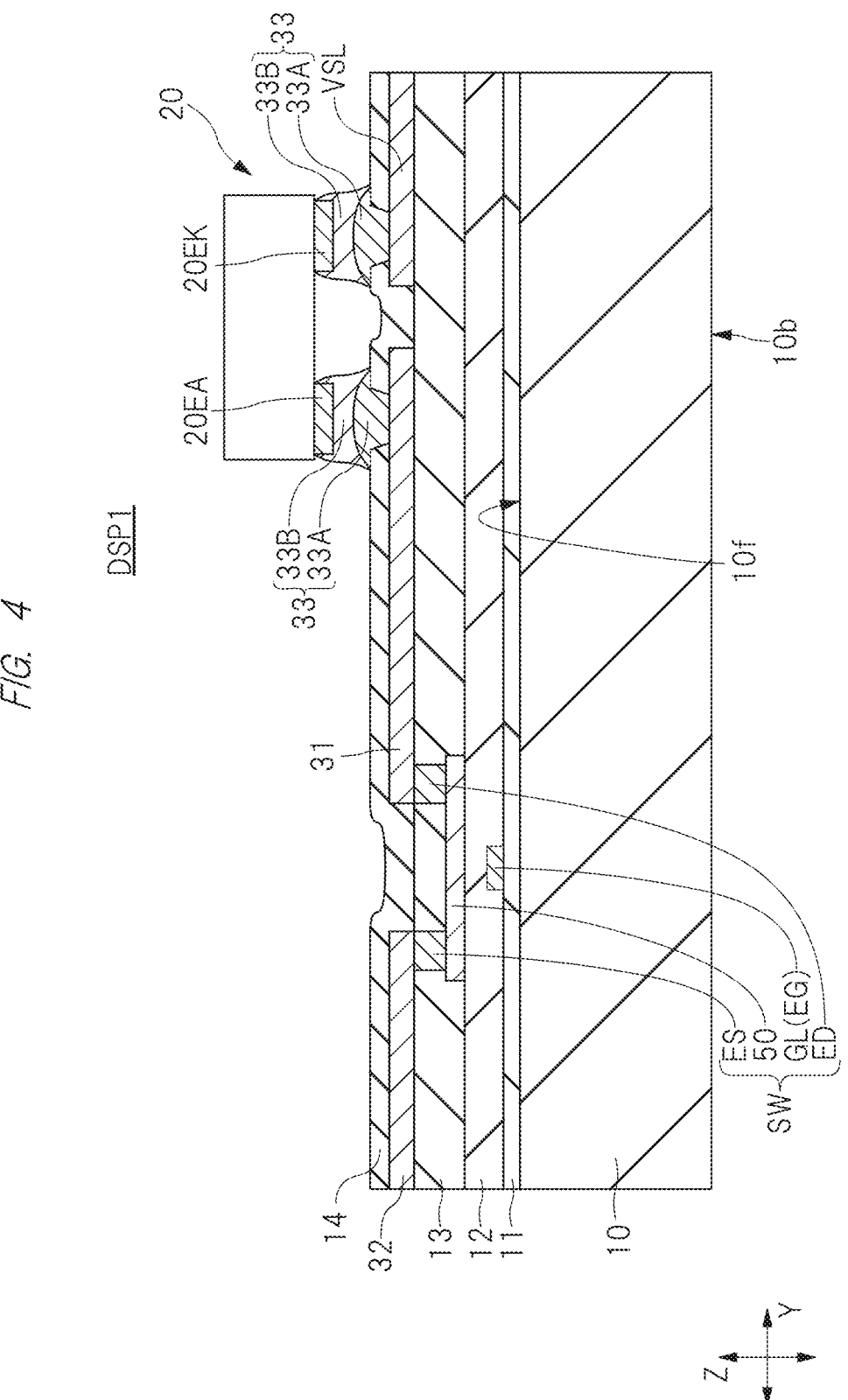
FIG. 4 is an enlarged sectional view taken along line A-A of FIG. 3.
Figure 5:
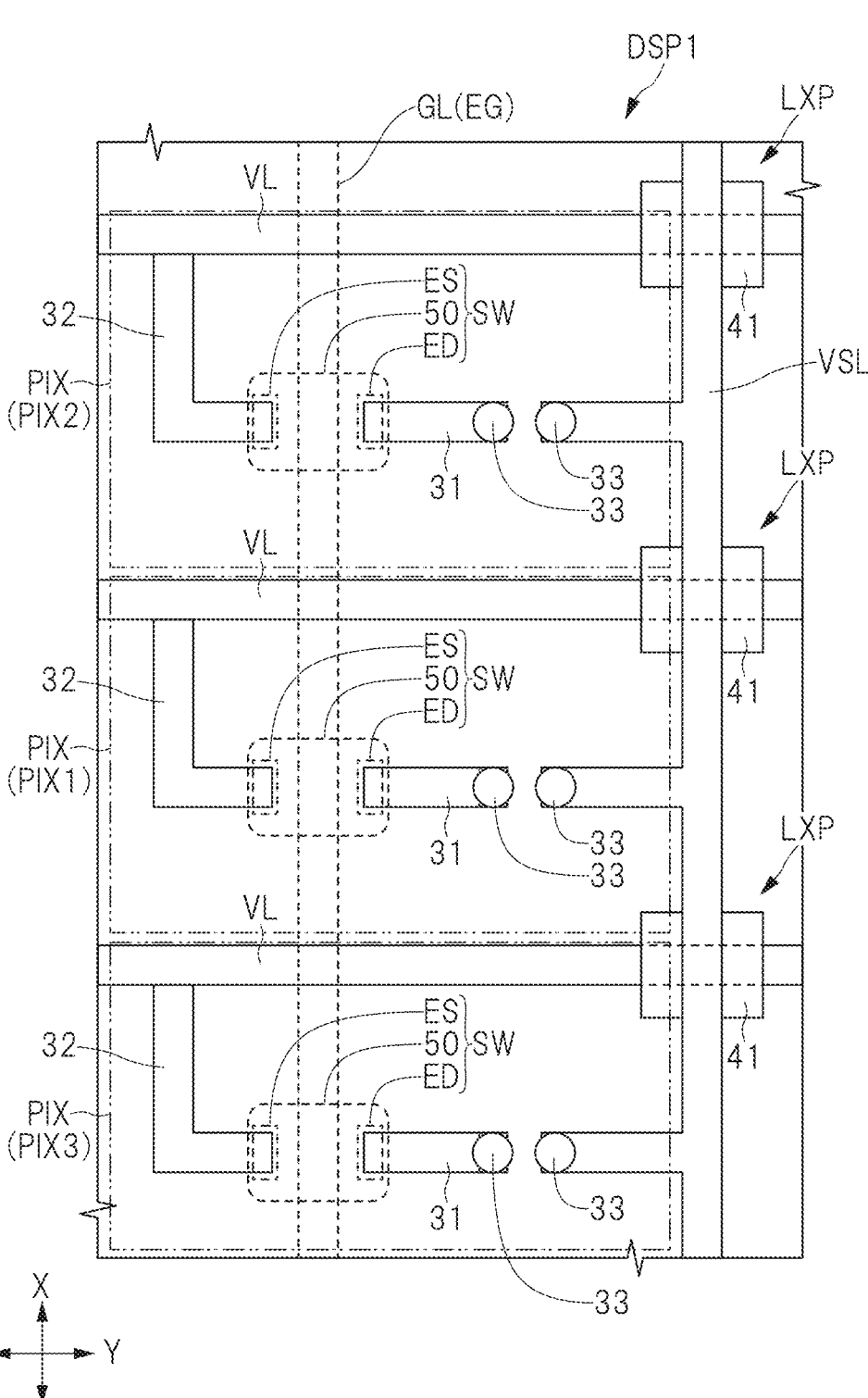
FIG. 5 is an enlarged plan view showing a state in which the LED element shown in FIG. 3 is removed.
Figure 6:
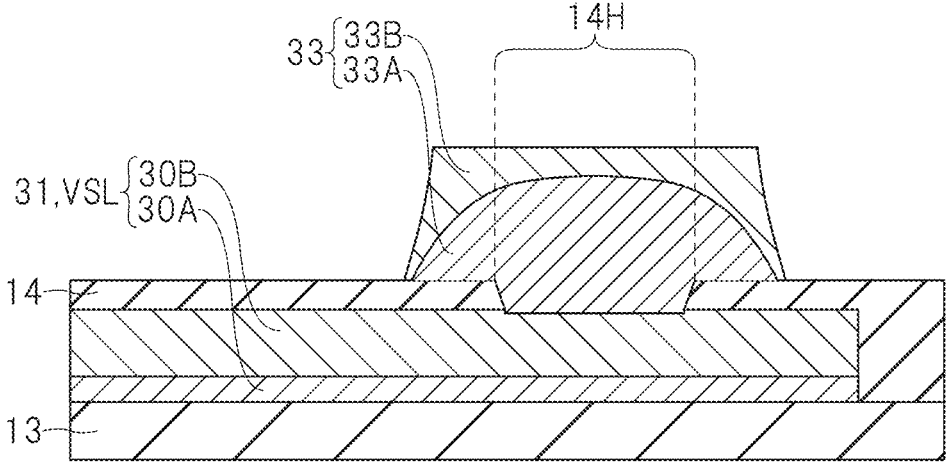
FIG. 6 is an enlarged sectional view of the vicinity of a bonding interface between a wiring and the bump electrode shown in FIG. 4.
Figure 7:
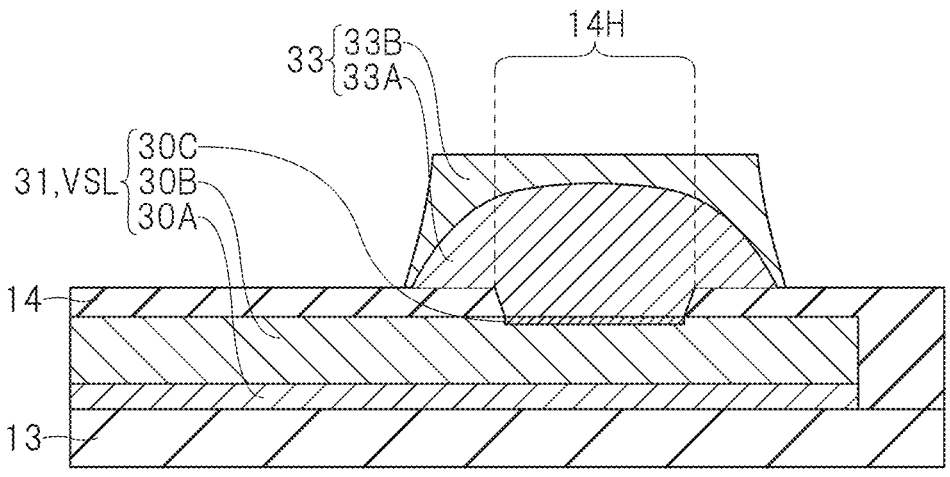
FIG. 7 is an enlarged sectional view showing a modification example to FIG. 6.
Figure 8:
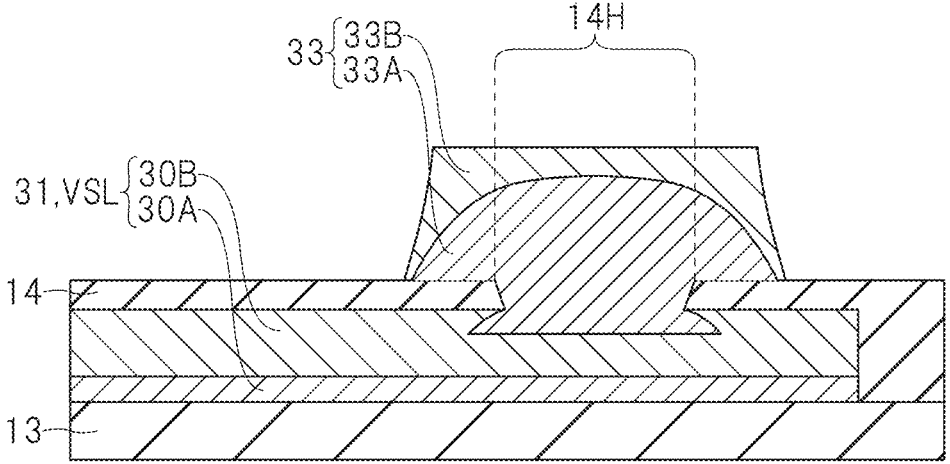
FIG. 8 is an enlarged sectional view showing another modification example to FIG. 6.
Figure 9:
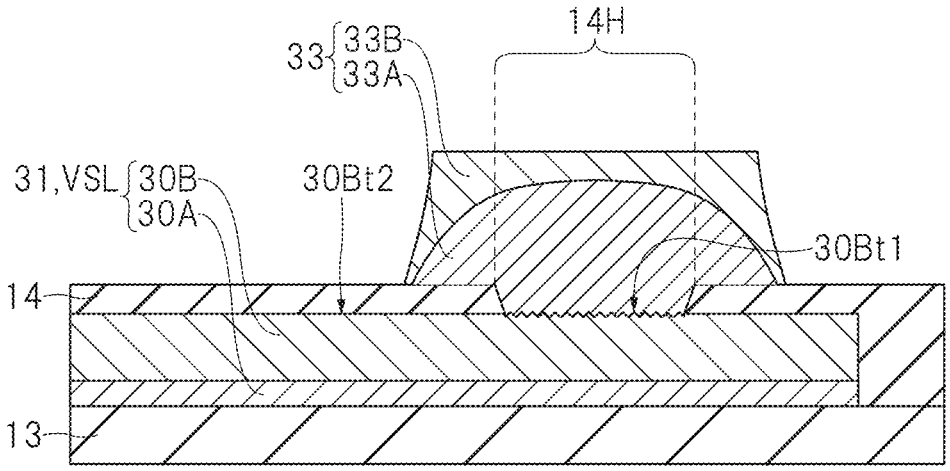
FIG. 9 is an enlarged sectional view showing yet another modification example to FIG. 6.

Next, a peripheral structure of the LED element arranged in each of the plurality of pixels PIX shown in FIG. 1 will be described. FIG. 3 is a transparent enlarged plan view showing one example of a peripheral structure of an LED element arranged in each of a plurality of pixels of the display apparatus shown in FIG. 1. In FIG. 3, illustration of an inorganic insulating layer 14 shown in FIG. 4 is omitted. In FIG. 3, outlines of semiconductor layers, electrodes, and scanning signal lines are indicated by dotted lines. FIG. 4 is an enlarged sectional view taken along line A-A of FIG. 3. FIG. 5 is an enlarged plan view showing a state in which the LED elements shown in FIG. 3 are removed. FIG. 6 is an enlarged sectional view of the vicinity of the bonding interface between the wiring and the bump electrode shown in FIG. 4. Each of FIGS. 7, 8, and 9 is an enlarged sectional view showing a modification example to FIG. 6.

As shown in FIG. 3, the display apparatus DSP1 has a plurality of pixels PIX (pixels PIX1, PIX2, and PIX3 in an example shown in FIG. 4) including a pixel PIX1. Each of the plurality of pixels PIX has a switching element SW, an LED element (light emitting element) 20, a wiring 31, and a wiring 32. Incidentally, the LED element 20 that emits visible light of any one of red, green, and blue, for example, is mounted on each of the pixels PIX1, PIX2, and PIX3, and a switching element SW for driving the LED element 20 is formed on each of the pixels PIX1, PIX2, and PIX3. Color display is possible by controlling outputs and timings of visible lights emitted from the LED elements of the pixels PIX1, PIX2, and PIX3. When the plurality of pixels PIX that emit visible lights of different colors are combined in this way, the pixel PIX for each color may be called a sub-pixel, and a set of the plurality of pixels PIX may be called a pixel. In the present embodiment, a portion corresponding to the above-mentioned sub-pixel is called a pixel PIX.

The wiring 31 is electrically connected to each of a drain electrode ED of the switching element SW and an anode electrode 20EA of the LED element 20. The wiring 32 is connected to a source electrode ES of the switching element SW. In the example shown in FIG. 3, the wiring 32 has a bent structure, one end being connected to the source electrode ES of the switching element SW, and the other end being connected to the wiring VL. The scanning signal line GL is used as the gate electrode EG of the switching element SW.

The display device DSP1 further has a wiring VL extending in a Y direction across the plurality of pixels PIX (see FIG. 2) and electrically connected to the wiring 32, and a wiring VSL extending across the plurality of pixels PIX along the X direction intersecting with (perpendicular to in FIG. 3) the Y direction and electrically connected to a cathode electrode 20EK of the LED element 20. The wiring VL and the wiring VSL intersect with each other via an insulating layer 41 at a wiring crossing portion LXP shown in FIG. 3. Since the insulating layer 41 is interposed between the wiring VL and the wiring VSL, the wiring VL and the wiring VSL are electrically separated. Incidentally, a layout shown in FIG. 3 is one example, and has various modification examples. For example, as one modification example to FIG. 3, the layout may have such a structure that the switching element SW has a unshown gate electrode and the gate electrode is connected to the scanning signal line GL. In this modification example, the scanning signal line GL may be arranged at such a position as not to overlapping a semiconductor layer 50.

As shown in FIG. 4, the display device DSP1 is an electronic device including a substrate 10 made of glass or a resin and a plurality of insulating layers laminated on the substrate 10. The plurality of insulating layers that the display device DSP1 has include an inorganic insulating layer 11, an inorganic insulating layer 12, an inorganic insulating layer 13, and an inorganic insulating layer 14 laminated on the substrate 10. The substrate 10 has a surface 10f and a surface 10b opposite to the surface 10f. Each of the inorganic insulating layers 11, 12, 13, and 14 is laminated on the surface 10f of the substrate 10.

The switching element SW includes an inorganic insulating layer 12 formed on the substrate 10, a semiconductor layer 50 formed on the inorganic insulating layer 12, a drain electrode ED connected to a drain region of the semiconductor layer 50, an inorganic insulating layer 13 covering the semiconductor layer 50. Each of the wiring 31 and the wiring 32 is a laminated film of a conductor layer 30A and a conductor layer 30B, as shown in FIG. 6. The conductor layer 30A is made of titanium or a titanium alloy and is formed on the inorganic insulating layer 13. The conductor layer 30B is made of aluminum or an aluminum alloy and is laminated on the conductor layer 30A.

An example shown in FIG. 4 is an example of a bottom-gate method in which the gate electrode EG is between the semiconductor layer 50 and the substrate 10. In a case of the bottom-gate method, a part of the inorganic insulating layer 12 between the gate electrode EG and the semiconductor layer 50 functions as a gate insulating layer. The inorganic insulating layer 12 also functions as a base layer for forming the semiconductor layer 50. Incidentally, a position of the gate electrode EG is not limited to the example shown in FIG. 4 and, for example, a top-gate method, which will be described later, may be used as a modification example.

A material (s) constituting each of the inorganic insulating layers 11, 12, 13, and 14 is not particularly limited. Silicon oxide ($SiO_2$) and silicon nitride (SiN), etc. can be exemplified. Further, the semiconductor layer 50 is a semiconductor film in which a silicon film made of, for example, silicon is doped with a P-type or N-type conductivity type impurity.

Each of the source electrode ES and the drain electrode ED is a contact plug for making electrical contact with either the source region or the drain region of the semiconductor layer 50. A material of the contact plug can be exemplified by tungsten, for example. As a modification example to FIG. 4, contact holes that expose the source region and the drain region of the semiconductor layer 50 are formed in the inorganic insulating layer 13, and a part of the wiring 31 and a part of the wiring 32 are embedded in the contact holes. In this case, the portions of the wirings 31 and 32 embedded in the contact holes are in contact with the semiconductor layer 50, and a contact interface between the wirings 31 and 32 and the semiconductor layer 50 can be regarded as the drain electrode ED and the source electrode ES.

Further, as shown in FIG. 5, the display device DSP1 includes a plurality of bump electrodes 33 regularly arranged in a plan view. The bump electrodes 33 are terminals for mounting electronic components on the substrate 10 (see FIG. 4). In this embodiment, the bump electrode 33 is a terminal for mounting the LED element 20 shown in FIG. 4. Consequently, one of the two bump electrodes is connected to the anode electrode 20EA of the LED element 20 and the other is connected to the cathode electrode 20EK of the LED element 20. Therefore, in the case of the present embodiment, two of the plurality of bump electrodes 33 are arranged adjacent to each other in a planned mounting region of the LED element 20 (see FIG. 3).

As shown in FIG. 6, the bump electrode 33 is connected to the wiring 31 at a position of overlapping an opening 14H formed in the inorganic insulating layer 14 and protrudes from the inorganic insulating layer 14. Further, the bump electrode 33 includes: a conductor portion 33A made of copper or a copper alloy and connected to the conductor layer 30B of the wiring 31; and a conductor portion 33B made of solder containing tin and formed on the conductor portion 33A. contains. By using the conductor portion 33A made of copper or a copper alloy in this manner, electrical characteristics of the bump electrode 33 can be improved.

By the way, in bonding the bump electrode 33 made of copper or a copper alloy to a wiring made of a TAT laminated film, it has been found that connection reliability between the uppermost titanium layer of the TAT laminated film and the copper of the bump electrode is low. As countermeasures against this problem, a method of roughening a surface of the uppermost titanium layer of the TAT laminated film, a method of forming a titanium film and a copper film in order on the TAT laminated film, and the like have been examined. However, the high connection reliability set by the inventors of the present application has not been obtained. In particular, when the bump electrodes are formed by: forming a uniform copper film; and then removing the unnecessary copper film by an etching process using a resist mask, a side surfaces become a precipitous state. Consequently, the bonding interface between the bump electrode and the wiring is likely to be destroyed with respect to a stress acting in a direction intersecting the side surface.

Therefore, the inventors of the present application have made an examination in which: a structure of the wiring 31 (and wiring VSL) connected to the bump electrode 33 shown in FIG. 4 is set as a laminated film configured by the conductor layer 30A and the conductor layer 30B; and the conductor layer 30B made of aluminum or an aluminum alloy and the conductor portion 33A made of copper or a copper alloy are bonded. An oxide film is likely to be formed on a surface of the conductor layer 30B that mainly contains aluminum. Therefore, after the opening 14H is formed, the oxide film is removed before the conductor portion 33A of the bump electrode 33 is formed. As a method for removing this oxide film, as will be described later, for example, an etching processing, a zincate treatment, or a method using these in combination can be exemplified. By forming the conductor portion 33B on the conductor layer 30B after removing the oxide film, a bonding strength at a bonding interface between copper and aluminum can be improved. Also, the strength of the bonding interface between aluminum and copper is stronger than a strength of a bonding interface between copper and titanium. Therefore, in the case of the present embodiment, the bonding strength between the wiring 31 (or the wiring VSL) and the bump electrode 33 can be improved.

Incidentally, in the methods for removing the oxide film described above, the zincate treatment is a treatment for replacing an oxide film of aluminum with a zincate film. Therefore, when a zincate treatment is performed as a processing for removing the oxide film, as shown in a modification example in FIG. 7, a conductor layer 30C containing zinc and laminated on the conductor layer 30B is further formed on a part overlapping the opening 14H among the wiring 31 (or the wiring VSL).

Further, the etching processing among the methods for removing the oxide film described above removes a part of the conductor layer 30B by bringing the part of the conductor layer 30B, which is exposed from the opening 14H, into contact with an etchant (or etching gas). For this purpose, by controlling times of an etching rate and the etching processing, as shown in FIG. 8, a part of the conductor layer 30B covered with the inorganic insulating layer 14 around the opening 14H is also removed. In this case, when the conductor portion 33A of the bump electrode 33 is formed after the etching processing, a part of the conductor portion 33A is embedded directly under the inorganic insulating layer 14 as shown in FIG. 8. In other words, in a case of a modification example shown in FIG. 8, a region where the part of the conductor portion 33A of the bump electrode 33 is embedded between the inorganic insulating layer 14 and the conductor layer 30B of the wiring 31 (or wiring VSL) is present around the opening 14H.

In a case of a structure shown in FIG. 8, the part of the conductor portion 33A embedded directly under the inorganic insulating layer 14 acts as an anchor. Therefore, even when a stress acting in a direction along the surface 10t of the substrate 10 shown in FIG. 4 is applied to the bump electrode 33, it is difficult to peel off the bump electrode 33 from the wiring 31 (or the wiring VSL). In other words, in the case of the structure shown in FIG. 8, the connection reliability between the bump electrode 33 and the wiring 31 (or the wiring VSL) can be improved by an anchor effect of the part of the conductor portion 33A embedded directly under the inorganic insulating layer 14. Incidentally, although FIG. 8 shows a modification example to FIG. 6, a technique of roughening the bonding interface between the conductor layer 30B and the conductor portion 33A as shown in FIG. 9 can be applied to the modification example shown in FIG. 7 in combination. When the modification example shown in FIG. 7 and the modification example shown in FIG. 8 are combined, the conductor layer 30C shown in FIG. 7 is formed between the conductor layer 30B and the conductor portion 33A shown in FIG. 8.

In addition, as another modification example, as shown in FIG. 9, by roughening the bonding interface between the bump electrode 33 and the wiring 31 (or the wiring VSL), the method of improving the connection reliability between the bump electrode 33 and the wiring 31 (or the wiring VSL) is also present. In an example shown in FIG. 9, in the conductor layer 30B of the wiring 31 (or wiring VSL), surface roughness of the bonding interface (surface 30Bt1 in FIG. 9) of the conductor layer 30B of the wiring 31 (or the wiring VSL) to the conductor portion 33A of the bump electrode 33 is rougher than surface roughness of a part (surface 30Bt2 in FIG. 9) covered with the inorganic insulating layer 14. This makes it possible to improve the bonding strength. Incidentally, although FIG. 9 is shown as a modification example to FIG. 6, a technique of roughening the bonding interface between the conductor layer 30B and the conductor portion 33A as shown in FIG. 9 can be applied in combination with the modification example shown in FIG. 7 and/or the modification example shown in FIG. 8. When the modification example shown in FIG. 7 and the modification example shown in FIG. 9 are combined, the bonding interface between the conductor layer 30C and the conductor portion 33A shown in FIG. 7 is a roughened surface that is rougher than surface roughness of the surface 30Bt2 similarly to the surface 30Bt1 shown in FIG. 9. Further, when the modification example shown in FIG. 8 and the modification example shown in FIG. 9 are combined, the bonding interface between the conductor layer 30B and the conductor portion 33A shown in FIG. 8 is a roughened surface that is rougher than the surface roughness of the surface 30Bt2 similarly to the surface roughness of the surface 30Bt1.

Figure 10:
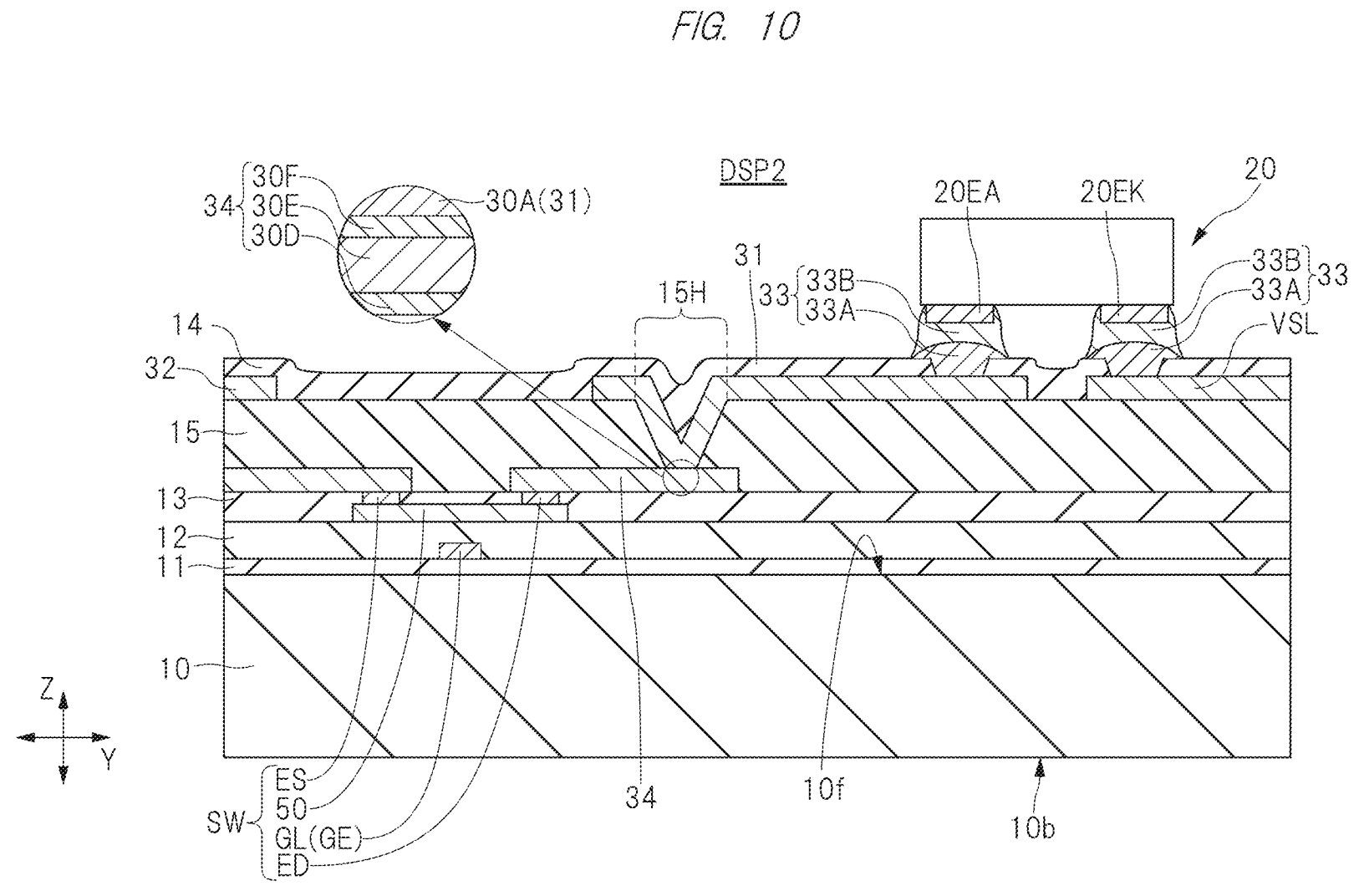

Further, FIG. 4 shows an example in which the wiring 31 is connected to the semiconductor layer 50 via the drain electrode ED. However, like the display device DSP2 shown as a modification example in FIG. 10, the wiring 31 connected to the bump electrode 33 may be connected to another wiring 34. FIG. 10 is an enlarged sectional view showing a modification example to FIG. 4.

A display device DSP2 shown in FIG. 10 is different from the display device DSP1 shown in FIG. 4 in further having a wiring 34 formed on the substrate 10 and an organic insulating layer 15 covering the wiring 34. The organic insulating layer 15 is made of a visible-light transmitting organic material (for example, a resin material) such as acrylic resin. The wiring 31 is formed on the organic insulating layer 15 and connected to the wiring 34 in an opening 15H formed in the organic insulating layer 15. The organic insulating layer 15 has higher hole-filling properties than the inorganic insulating layer 14. Therefore, by arranging the organic insulating layer 15 under the wiring 31 connected to the bump electrode 33, flatness of a base layer for forming the bump electrode 33 can be improved.

Also, in a case of a conductor pattern that does not come into contact with the conductor portion 33A made of copper or a copper alloy like the wiring 34, a TAT laminated film can be used. In an example shown in FIG. 10, the wiring 34 is a laminated film composed of: a conductor layer 30D made of titanium or a titanium alloy; a conductor layer 30E made of aluminum or an aluminum alloy and laminated on the conductor layer 30D; and a conductor layer F made of titanium or a titanium alloy and laminated on the layer 30E. At the opening 15H, the conductor layer 30F of the wiring 34 and the conductor layer 30A of the wiring 31 are bonded.

<Method of Manufacturing Electronic Device>

Figure 11:
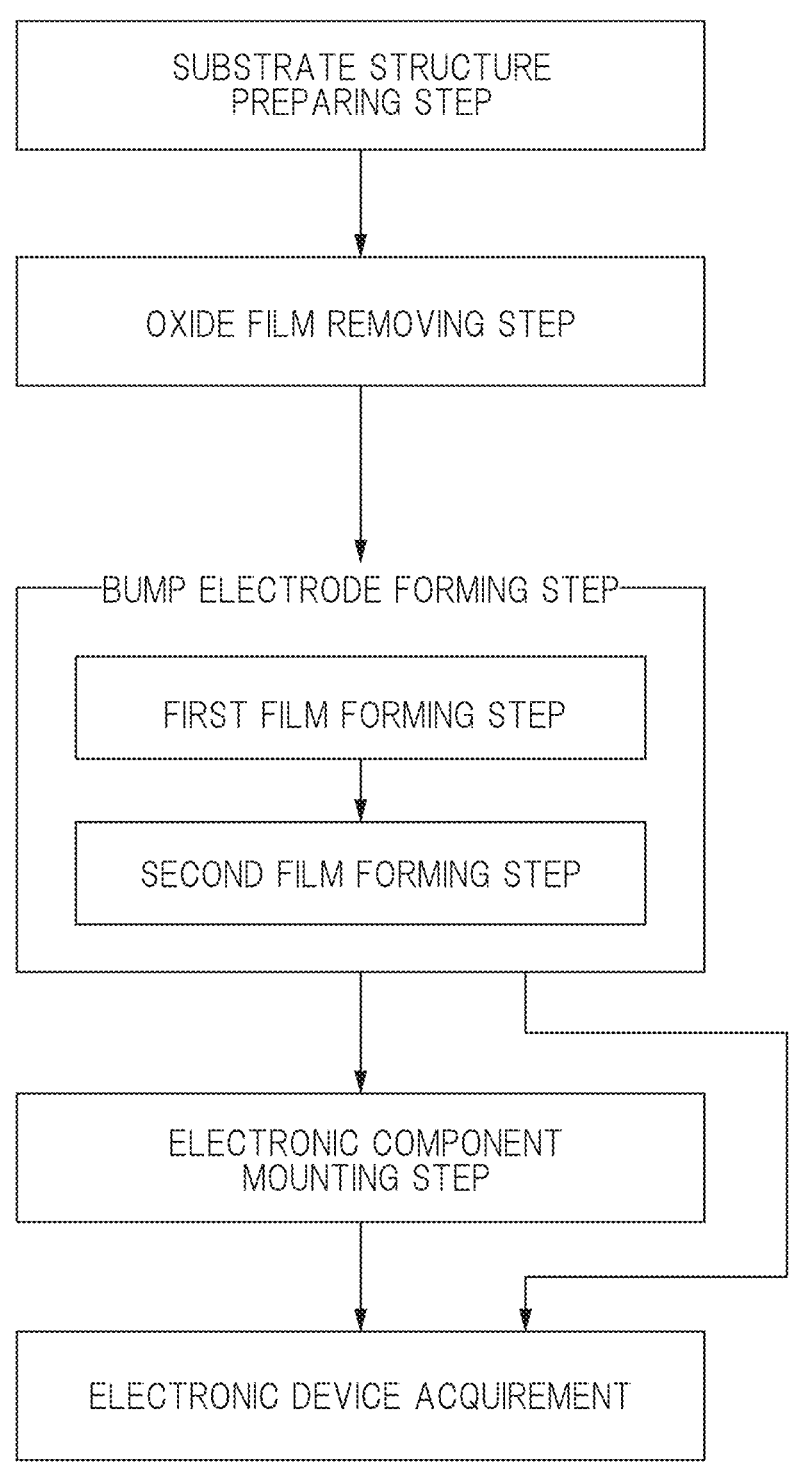
FIG. 11 is an explanatory diagram showing one example of a process flow of a manufacturing method of a display apparatus which is an embodiment of an electronic device.

Next, a method of manufacturing an electronic device of the present embodiment will be described by using the method of manufacturing the display device DSP1 shown in FIG. 3 as a representative example. Incidentally, hereinafter, a process of forming the bump electrode 33 in the opening 14H shown in FIG. 4 will be mainly described. FIG. 11 is an explanatory diagram showing one example of a process flow of a method of manufacturing a display device, which is an embodiment of an electronic device.

As shown in FIG. 11, a method of manufacturing an electronic device according to the present embodiment includes a substrate structure preparing step, an oxide film removing step, a bump electrode forming step, and an electronic component mounting step. Incidentally, the electronic component mounting step can be omitted when a substrate structure before electronic components are mounted is shipped as a semi-finished product.

Figure 12:
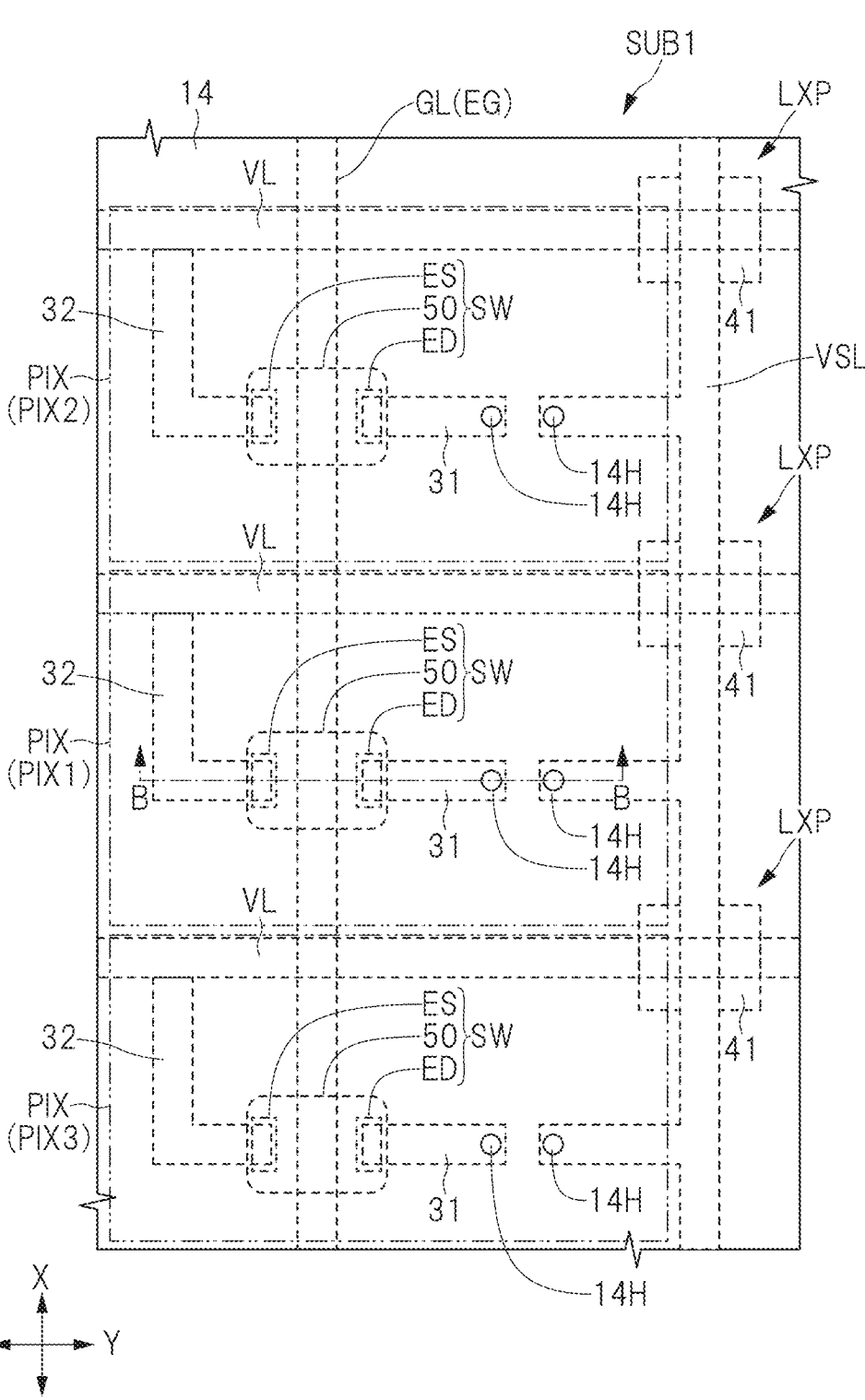
FIG. 12 is an enlarged plan view of a substrate structure prepared in a substrate structure preparing step shown in FIG. 11.
Figure 13:
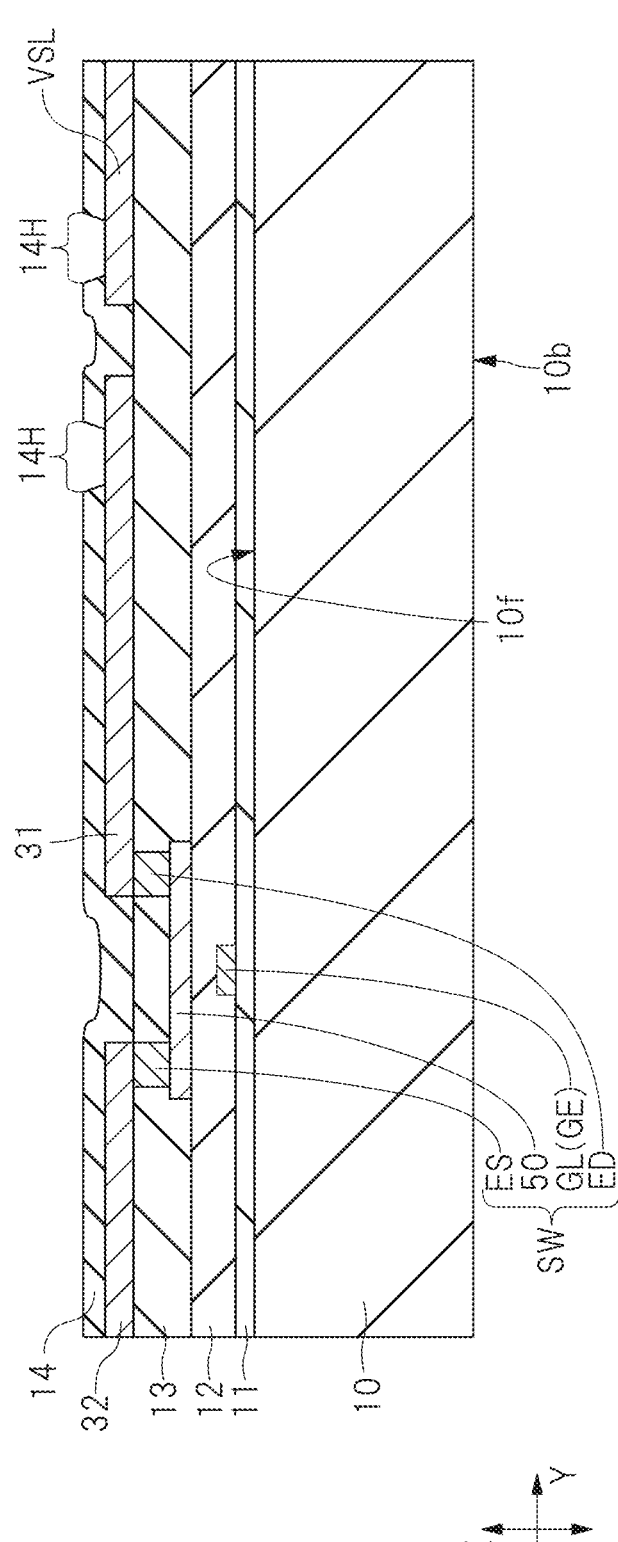
FIG. 13 is an enlarged sectional view taken along line B-B of FIG. 12.

In the substrate structure preparing step shown in FIG. 11, a substrate structure SUB1 shown in FIGS. 12 and 13 is prepared. FIG. 12 is an enlarged plan view of a substrate structure prepared in the substrate structure preparing step shown in FIG. 11. FIG. 13 is an enlarged sectional view taken along line B-B of FIG. 12. As shown in FIG. 13, in the substrate structure preparing step, the substrate structure SUB1 including a substrate 10 made of glass or a resin, a wiring 31 formed on the substrate 10, and an inorganic insulating layer 14 covering the wiring 31 is prepared. In an example shown in FIG. 13, an inorganic insulating layer 11, an inorganic insulating layer 12, an inorganic insulating layer 13, and an inorganic insulating layer 14 are laminated on the substrate 10, and the wiring 31 is arranged between the inorganic insulating layer 13 and the inorganic insulating layer 14. Most of the substrate structure SUB1 is covered with the inorganic insulating layer 14. In the inorganic insulating layer 14, openings 14H are formed at a position overlapping the wiring 31 and at a position of overlapping the wiring VSL. The wiring 31 and the wiring VSL are each exposed from the inorganic insulating layer 14 at a bottom of the opening 14H.

Figure 14:
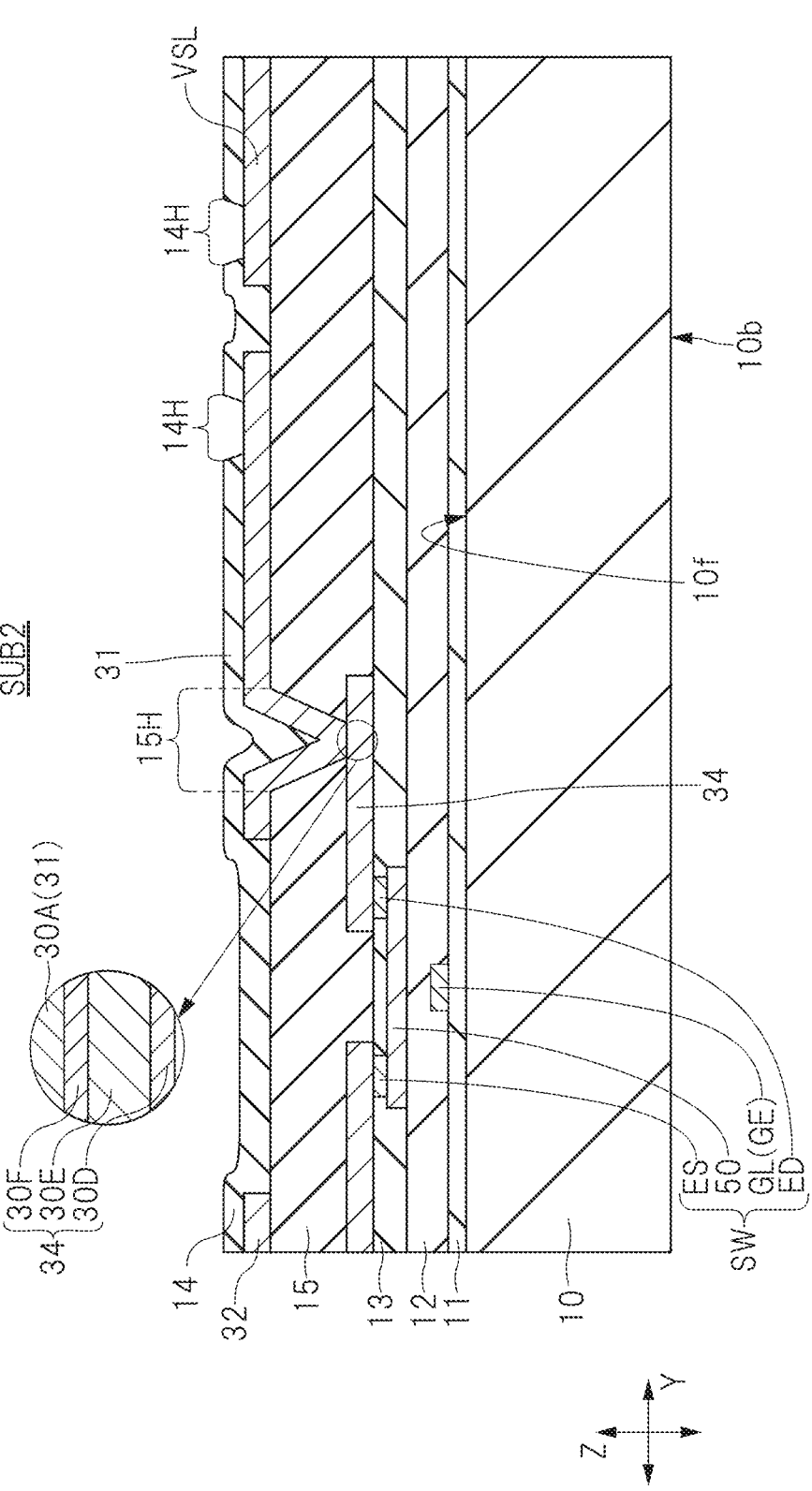
FIG. 14 is an enlarged sectional view showing a modification example to FIG. 13.

As shown in FIG. 12, in a plan view, each of the plurality of openings 14H is regularly arranged in a planned region for mounting the electronic component (the LED element 20 shown in FIG. 3). In other words, in a plan view, each of the plurality of openings 14H is formed in a planned region for forming the bump electrode 33 shown in FIG. 4. In manufacturing the display device DSP1 described with reference to FIG. 10, the substrate structure SUB2 shown in FIG. 14 is prepared in the substrate structure preparing step shown in FIG. 11. FIG. 14 is an enlarged sectional view showing a modification example to FIG. 13.

The substrate structure SUB2 shown in FIG. 14 differs from the substrate structure SUB1 shown in FIG. 13 in the following points. That is, the substrate structure SUB2 is different in further having the wiring 34 formed on the substrate 10 and the organic insulating layer 15 covering the wiring 34 in addition to the substrate structure SUB1 shown in FIG. 13. Further, he wiring 31 is formed on the organic insulating layer 15 and connected to the wiring 34 in the opening 15H formed in the organic insulating layer 15. Further, the wiring 34 is a laminated film of a conductor layer 30D made of titanium or a titanium alloy, a conductor layer 30E made of aluminum or an aluminum alloy and laminated on the conductor layer 30D, and a conductor layer 30F made of titanium or a titanium alloy and laminated on the conductor layer 30E. At the opening 15H, the conductor layer 30F of the wiring 34 and the conductor layer 30A of the wiring 31 are bonded.

Figure 15:
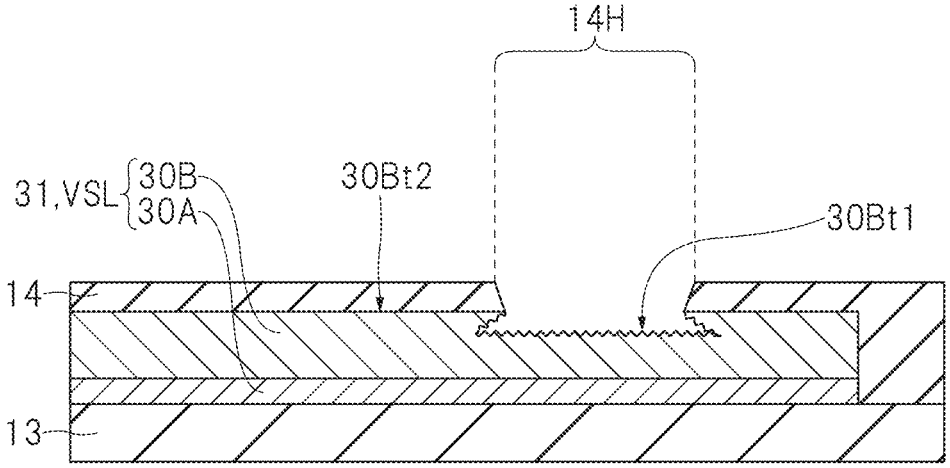
FIG. 15 is an enlarged sectional view showing a state in which an oxide film of aluminum is removed by an etching processing in an oxide film removing step shown in FIG. 11.
Figure 16:
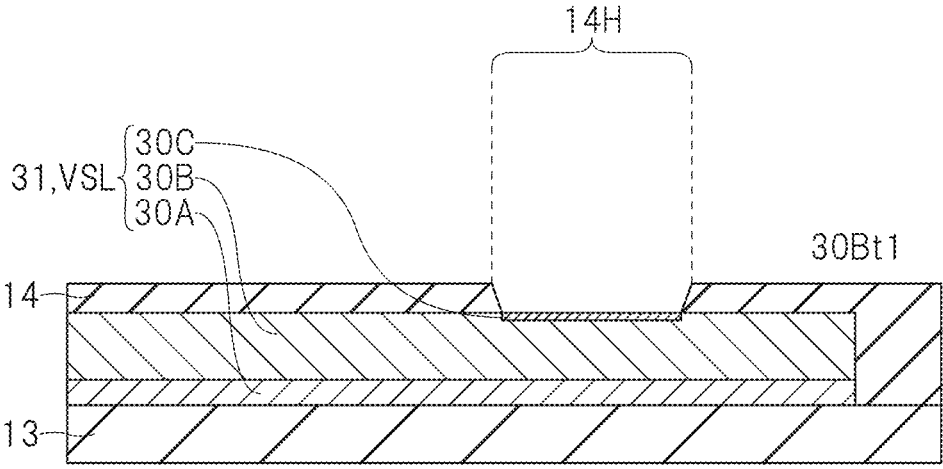
FIG. 16 is an enlarged sectional view showing a state in which an oxide film of aluminum is removed by zincate treatment in the oxide film removing step shown in FIG. 11.

Next, in the oxide film removing step shown in FIG. 11, the oxide film of aluminum, which is formed on an exposed surface of the wiring 31 (and the wiring VSL) is removed at a position of overlapping the opening 14H formed in the insulating layer 14 shown in FIG. 13 or 14. Each of FIGS. 15 and 16 is an enlarged sectional view showing a state in which the oxide film of aluminum in the oxide film removing step shown in FIG. 11 has been removed. As an example of a method of removing the oxide film of aluminum, for example, exemplified can be an etching processing illustrated in FIG. 15, a zincate treatment illustrated in FIG. 16, or a method of combining those.

In the example shown in FIG. 13 or 14, an oxide film is formed on a part of the wiring 31 (and the wiring VSL) that is exposed in the opening 14H. In a case of an example shown in FIG. 15, the conductive layer 30B is selectively etched by bringing an etchant or etching gas into contact with the exposed surface of the wiring 31 (and the wiring VSL). In the etching processing, when an etching material etched isotropically from a contact surface with the etching material is used, a part of the conductor layer 30B sandwiched between the inorganic insulating layer 14 and the conductor layer 30A is partially etched. Therefore, as shown in FIG. 15, a space exists between the inorganic insulating layer 14 and the conductor layer 30B of the wiring 31 (or wiring VSL) around the opening 14H. Consequently, the part of the conductor portion 33A is embedded directly under the inorganic insulating layer 14, as described with reference to FIG. 8. Also, in the etching processing, exposure of the etched conductor layer 30B may be roughened by adjusting an etching time and an etching material. In the case of the example shown in FIG. 15, after the oxide film removing step, surface roughness of a part of the conductor layer 30B of the wiring 31 (or wiring VSL), which is exposed from the inorganic insulating layer 14 (surface 30Bt1 in FIG. 15) is rougher than surface roughness of a part covered with the inorganic insulating layer 14 (surface 30Bt2 in FIG. 9). In this case, as described with reference to FIG. 9, the bonding strength between the conductor portion 33A and the conductor layer 30B can be improved.

In a case of an example shown in FIG. 16, the oxide film of aluminum, which is formed on the exposed surface of the wiring 31 (and the wiring VSL), is subjected to a zincate treatment to replace the oxide film of aluminum with a zincate film. The zincate treatment is a method of dissolving aluminum by bringing it into contact with a zincate solution, and depositing a zincate film on the surface of the conductor layer 30B by reducing zinc in the zincate solution. As a result, as described with reference to FIG. 7, the conductor layer 30C containing zinc and laminated on the conductor layer 30B is further formed in the portion of the wiring 31 (or wiring VSL) overlapping the opening 14H. Since oxidization of the conductor layer 30C is more difficult than that of the conductor layer 30B, the electrical connection reliability between the bump electrode 33 (see FIG. 7) made of copper or a copper alloy and the conductor portion 33A (see FIG. 7) can be improved.

Incidentally, the zincate treatment described with reference to FIG. 16 may be performed after the etching processing described with reference to FIG. 15 is performed. In this case, the conductor layer 30C shown in FIG. 16 is formed on the entire exposed surface of the conductor layer 30B shown in FIG. 15, which is exposed from the inorganic insulating layer 14. When the etching processing and the zincate treatment are combined and even if the surface of the conductor layer 30B etched after performing the etching processing and before starting the bump electrode forming step shown in FIG. 11 is oxidized, the oxide film can be removed again. When the etching processing and the zincate treatment are combined, a surface roughening treatment by etching described with reference to FIG. 15 can be performed together. The conductor layer 30C is formed following a surface condition of the underlying conductor layer 30B, so that if the surface of the conductor layer 30B is roughened as shown in FIG. 15, the surface roughness of the conductor layer 30C to be coated is rougher than the surface roughness of the surface 30Bt2 shown in FIG. 15.

Figure 17:
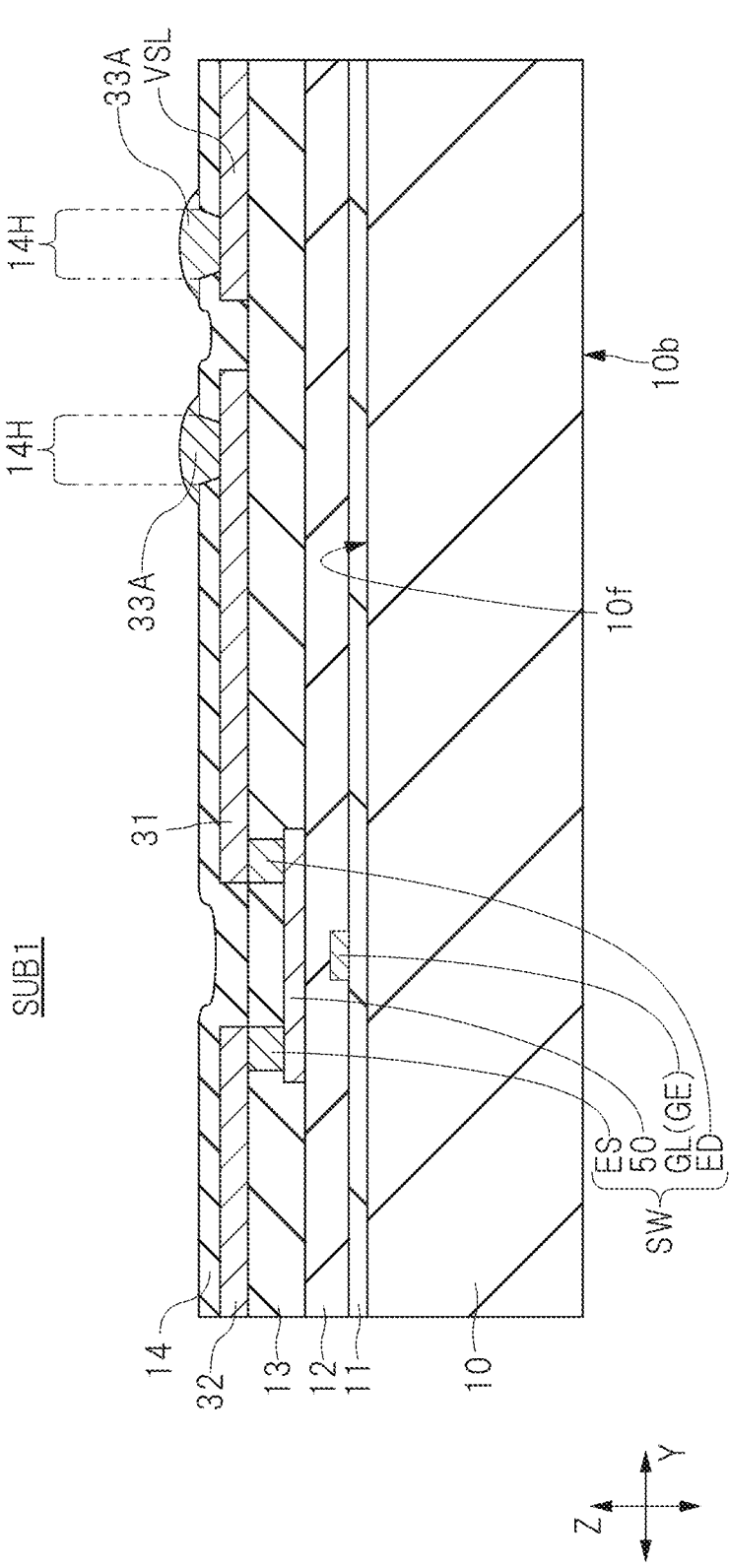
FIG. 17 is an enlarged sectional view showing a first film forming step shown in FIG. 11.
Figure 18:
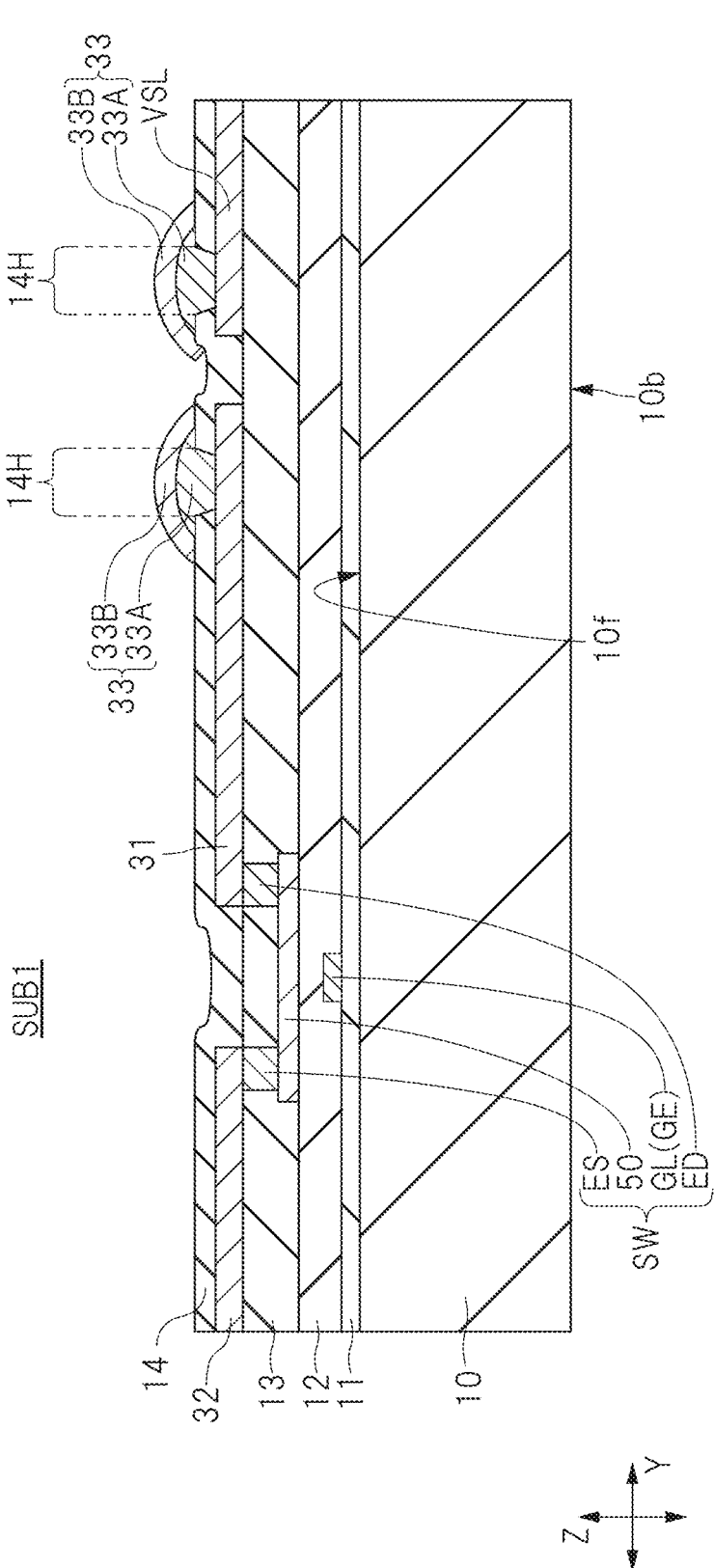
FIG. 18 is an enlarged sectional view showing a second film forming step shown in FIG. 11.

Next, in the bump electrode forming step shown in FIG. 11, the bump electrodes 33 described with reference to FIG. 4 or FIG. 10 are formed. As a representative example, a step of forming the bump electrode 33 shown in FIG. 4 will be illustrated and described below, but a method of forming the bump electrode 33 shown in FIG. 10 is also the same. FIG. 17 is an enlarged sectional view showing a first film forming step shown in FIG. 11. FIG. 18 is an enlarged sectional view showing a second film forming step shown in FIG. 11. Each of FIGS. 17 and 18 corresponds to a cross-section shown in FIG. 13.

First, in the first film forming step, the conductor portion 33A shown in FIG. 17 is formed. As a method of forming a metal film made of copper or a copper alloy, a method of growing a copper film uniformly on the inorganic insulating layer 14 and then removing the unnecessary copper film by using a resist mask (hereinafter referred to as a study example method of forming a bump electrode). However, in this case, the side surface of the bump electrode obtained as described above becomes a precipitous wall, and the bonding interface between the bump electrode and the wiring is likely to be destroyed by a stress acting in a direction intersecting the side surface. From the viewpoint of the manufacturing method, in addition to the step of forming a copper film, a step of forming a resist mask, a step of selectively forming openings in a resist mask by using a photolithography technique, a step of selectively etching the copper film through the resist mask in which the openings have been formed, a step of removing the resist mask, and the like are required. Thus, in a case of the study example method of forming the bump electrode, since the manufacturing process becomes complicated, there is room for improvement in terms of improving manufacturing efficiency. Further, in order to perform an exposure processing of the resist mask with high precision, an exposure apparatus such as a stepper is required, and a large exposure apparatus corresponding to a size of the substrate 10 must be prepared.

In the case of the present embodiment, the conductor portion 33A made of copper or a copper alloy is formed by an electroplating method while the wiring 31 (or the wiring VSL) is energized. Specifically, while the wiring 31 (or the wiring VSL) is energized, the conductor 33A made of copper or a copper alloy is selectively formed on and around the opening 14H by an electroplating method. In this case, a copper film (or a copper alloy film) can be selectively grown from the contact interface with the wiring 31 (or wiring VSL). Therefore, the manufacturing process can be made more efficient as compared with the study example method of forming the bump electrode. Further, in the case of the present embodiment, a copper film can be selectively grown on a part of the wiring 31 (or wiring VSL) exposed from the inorganic insulating layer 14. For this purpose, it is not necessary to newly prepare a large-scale exposure apparatus such as a large-sized stepper. Incidentally, since a current can flow through the wiring 31 and the wiring VSL at the same time, the conductor portion 33A on the wiring 31 and the conductor portion 33A on the wiring VSL can be collectively formed at the same timing.

In the first film forming step, when the conductor portion 33A made of copper or a copper alloy is formed by an electroplating method, the conductor portion 33A grows in the opening 14H following a shape of the opening 14H. Moreover, in an upper part of the opening 14H, it grows isotropically around the opening 14H. Therefore, the conductor portion 33A extends (spreads) around the opening 14H. Since the conductor portion 33A extending around the opening 14H is in close contact with the inorganic insulating layer 14, by increasing an area of a portion extending around the opening 14H an adhesion area between the conductor portion 33A and the inorganic insulating layer 14 can be increased. Further, when a part of the conductor portion 33A extends isotropically around the opening 14H as in the present embodiment, as shown in FIG. 3 each of the plurality of bump electrodes 33 forms a circle in a plan view. In an example shown in FIG. 12, the shape of the opening 14H is also circular, but even if the shape of the opening 14H is square, a planar shape of the bump electrode 33 is circular. Furthermore, as shown in FIG. 17, a cross-sectional shape of the conductor portion 33A has a "mushroom shape" whose umbrella portion protrudes above the inorganic insulating layer 14.

Next, in a second film forming step shown in FIG. 11, after the first film forming step, as shown in FIG. 18, a conductor portion 33B made of solder containing tin is selectively formed on the conductor portion 33A. Also in a case of forming a solder film, similarly to a case of forming a copper film in the first film forming step, by using an electroplating method the solder film is isotropically extended on the surface of the energized conductor portion 33A, and the conductor portion 33B is formed. Incidentally, the shape of the conductor portion 33B shown in FIG. 18 is different from the shape of the conductor portion 33B shown in FIG. 4. This is because the solder melts due to a reflow process that is performed when the electronic component is mounted in the electronic component mounting step shown in FIG. 11 and the shape is changed. Immediately after the second film forming step is completed, the dome-shaped conductor portion 33B covering the entire umbrella portion of the mushroom-shaped conductor portion 33A is formed.

Incidentally, in the step of forming the conductor portion 33A, the entire opening 14H may not be filled with copper or a copper alloy. In this case, part of the conductor portion 33B may be embedded in the opening 14H in the second film forming step. Further, as described with reference to FIG. 16, when a space is formed between the inorganic insulating layer 14 and the conductor layer 30A, a part of the solder may be embedded in the space.

As described above, the substrate structure SUB1 before mounting the electronic components may be shipped as a semi-finished product. In this case, the electronic component mounting step shown in FIG. 11 is omitted, the substrate structure SUB1 shown in FIG. 18 is subjected to necessary inspections and packaging, and then preparations for shipping are started. That is, the substrate structure SUB1 as an electronic device is obtained by the second film forming process of FIG. 18.

Next, in the electronic component mounting step shown in FIG. 11, after the bump electrode forming step, the bump electrodes 33 and the electronic component (LED element 20 in the example of FIG. 4) are electrically connected as shown in FIG. 4. In this step, the conductor part 33B shown in FIG. 18 is melted by the reflow process, and is bonded to an anode electrode 20EA or a cathode electrode 20EK of the LED element 20. Incidentally, a solder film may be previously formed on each of the anode electrode 20EA and the cathode electrode 20EK of the LED element 20 before this step. In this case, since the conductor portion 33B made of solder and the solder film formed on the electrode can be easily integrated, the bump electrode 33 and the cathode electrode 20EK (or the anode electrode 20EA) can be reliably connected.

Through the above steps, the display device DSP1 as an electronic device shown in FIG. 3 is obtained. After this step, the display device DSP1 is subjected to necessary inspections and packing, preparations for shipping are started.

Although the embodiment and the representative modification examples have been described above, the above technique can be applied to various modification examples other than the illustrated modification examples. For example, the modification examples described above may be combined to each other.

Within the scope of the idea of the present invention, those skilled in the art can arrive at various modification examples and correction examples, and it is understood that these modification examples and correction examples also fall within the scope of the present invention. For example, addition, deletion, or design change of components, or addition, omission, or condition change with respect to the above-described embodiments by those skilled in the art is also included in the scope of the present invention as long as it has the gist of the present invention.

The present invention can be used for display devices and electronic devices incorporating the display devices.

What is claimed is:

1. An electronic device comprising:
a first substrate made of glass or a resin;
a first wiring formed on the first substrate;
a first insulating layer being an inorganic insulating layer which is made of an inorganic material, the first insulating layer covering the first wiring; and
a bump electrode connected to the first wiring at a position of overlapping a first opening formed in the first insulating layer, the bump electrode protruding from the first insulating layer,

wherein the first wiring is a laminated film of:
a first conductor layer, which is made of titanium or a titanium alloy and is formed on the first substrate; and
a second conductor layer, which is made of aluminum or an aluminum alloy and is laminated on the first conductor layer, and
the bump electrode includes:
a first conductor portion, which is made of copper or a copper alloy and is bonded to the first wiring; and
a second conductor portion, which is made of solder containing tin and is formed on the first conductor portion.

2. The electronic device according to claim 1, wherein a third conductor layer containing zinc and laminated on the second conductor layer is further formed in a part of the first wiring overlapping the first opening.

3. The electronic device according to claim 2, wherein a region in which a part of the first conductor portion of the bump electrode is embedded between the first insulating layer and the second conductor layer of the first wiring exists around the first opening.

4. The electronic device according to claim 1, wherein a region in which a part of the first conductor portion of the bump electrode is embedded between the first insulating layer and the second conductor layer of the first wiring exists around the first opening.

5. The electronic device according to claim 1, wherein surface roughness of a bonding interface between the second conductor layer of the first wiring and the first conductor portion of the bump electrode is rougher than surface roughness of a part covered with the first insulating layer.

6. The electronic device according to claim 1, wherein a planar shape of the bump electrode is a circular shape in a plan view.

7. The electronic device according to claim 1, further comprising:
a second wiring formed on the first substrate; and
a second insulating layer being an organic insulating layer made of an organic material, the second insulating layer covering the second wiring,
wherein the first wiring is formed on the second insulating layer and is connected to the second wiring in a second opening formed in the second insulating layer.

8. The electronic device according to claim 7, wherein the second wiring is a laminated film of:
a fourth conductor layer made of titanium or a titanium alloy;
a fifth conductor layer made of aluminum or an aluminum alloy and laminated on the fourth conductor layer; and
a sixth conductor layer made of titanium or a titanium alloy and laminated on the fifth conductor layer, and
the sixth conductor layer of the second wiring and the first conductor layer of the first wiring are bonded in the second opening.

* * * * *